United States Patent [19]
Tada et al.

[11] Patent Number: 5,849,454
[45] Date of Patent: Dec. 15, 1998

[54] APPARATUS AND METHOD FOR COATING, APPARATUS AND METHOD FOR COATING AN ELECTROPHOTOGRAPHIC PHOTOSENSITIVE MEMBER

[75] Inventors: Kazuyuki Tada; Mamoru Fujita; Masaru Agatsuma; Tomomasa Sato, all of Minami-ashigara, Japan

[73] Assignee: Fuji Xerox Co., Ltd., Tokyo, Japan

[21] Appl. No.: 861,734

[22] Filed: May 22, 1997

[30] Foreign Application Priority Data

May 29, 1996 [JP] Japan .................................. 8-135600

[51] Int. Cl.$^6$ ................................ B05D 1/18; B05C 3/12
[52] U.S. Cl. ........................ 430/127; 118/419; 427/430.1
[58] Field of Search ............................ 430/127; 118/423, 118/419, 413, 245; 427/430.1

[56] References Cited

U.S. PATENT DOCUMENTS

| | | | |
|---|---|---|---|
| 5,244,697 | 9/1993 | Vackier et al. | 430/127 |
| 5,422,144 | 6/1995 | Speakman | 430/127 |
| 5,707,449 | 1/1998 | Ohira et al. | 118/423 |

FOREIGN PATENT DOCUMENTS

| | | |
|---|---|---|
| 56-15864 | 2/1981 | Japan . |
| 56-15865 | 2/1981 | Japan . |
| 56-15866 | 2/1981 | Japan . |

*Primary Examiner*—John Goodrow
*Attorney, Agent, or Firm*—Oliff & Berridge, PLC

[57] ABSTRACT

A coating apparatus comprises a coating vessel holding a coating liquid with a liquid leakage preventing member having an opening. A cylindrical member such as a cylindrical support for supporting a photosensitive member is inserted into the opening and the cylindrical member is moved relative to the coating liquid vessel in the vertical direction. A scraping member for scraping the coating liquid is at least partially immersed in the coating liquid, or is positioned above the surface of the coating liquid in the coating liquid vessel, the scraping member being almost concentric to the cylindrical member and movable in the radial direction of the cylindrical member. The cylindrical member is axially aligned with the scraping member using coating liquid pressure applied to the scraping member to coincide the center of the scraping member with the center of the cylindrical member. This invention provides an apparatus and method for forming a coated layer having a uniform layer thickness free of unevenness on the outer periphery of a cylindrical member such as an electrophotographic photosensitive support at a high production rate inexpensively.

27 Claims, 4 Drawing Sheets

APPARATUS AND METHOD FOR COATING, APPARATUS AND METHOD FOR COATING AN ELECTROPHOTOGRAPHIC PHOTOSENSITIVE MEMBER

BACKGROUND OF THE INVENTION

1. Field of the Invention

This invention relates to an apparatus and method for coating a making liquid on a cylindrical member, to an apparatus and method for making an electrophotographic photosensitive member, by coating liquid which forms a photoreceptor on a drum for an electrophotographic photosensitive member.

2. Description of the Related Art

Conventionally, a dipping coating method and a vertical type coating method are known as methods for coating a coating material on a cylindrical member. The dipping coating method has the advantage of simple operation. However, it has the following drawbacks: Specifically, it is necessary to dip the cylindrical member slowly into the coating liquid for stabilizing the liquid surface at the upper portion of a dipping vessel and for stabilizing the flow of the coating liquid inside the vessel. Therefore, there is a need for long dipping time. Also, in order to prevent the inside of the cylindrical member from being coated with the coating liquid, a mechanism for sealing the inside of the cylindrical member is required. Also, even if the inside of the cylindrical member is sealed, it is unavoidable that the coating liquid adheres to a bottom edge of the inside of the cylindrical member and hence it is necessary to provide a process for removing the adhered coating liquid. Further, because the coated layer thickness depends on viscosity and coating velocity, strict viscosity control is required. The coating velocity is so low that productivity is impaired. In addition, because the cylindrical member is entirely dipped in the coating liquid, a great amount of coating liquid is required.

The conventional vertical type coating method comprises using a coating vessel holding ring-shaped elastic packing for preventing liquid leakage, inserting the cylindrical member into an opening of the elastic packing, and uplifting the cylindrical member relative to the coating vessel so that the outer periphery of the cylindrical member is coated with a coating liquid. The dipping time required is shorter than for the dipping method, allowing the manufacturing speed to be slightly higher. Also, the vertical type coating method has the advantages that the process for removing the coating liquid adhering to the inside of the cylindrical member is not required, the coating process can be carried out using a small amount of coating liquid, and continuous coating can be practiced by continuously supplying the cylindrical member to the coating vessel.

However, in the vertical type coating method, the coated layer thickness depends on the viscosity and the coating velocity so that strict viscosity control is required. The drawback that the coating velocity is so low that the impairment of productivity is not eliminated.

In order to eliminate the above drawback, Japanese Patent Application Laid-Open (JP-A) Nos. 56-15865 and 56-15866 disclose vertical type coating methods using a ring blade for scraping the applied material, which is provided in the upper portion of a coating vessel. In such a coating method (blade coating method), the thickness in a wet condition is determined depending on a gap between a substrate to be coated and the blade and not so much depending on the physical properties of the coating liquid or operating conditions, which allows high-speed coating. However, it is indispensable to control the gap between the substrate and the blade in order to obtain a uniform coated layer thickness. The methods disclosed in Japanese Patent Application Laid-Open (JP-A) Nos. 56-15865 and 56-15866 suggest the use of a device, that is a self-axis-aligning mechanism, for controlling the gap. In this device, the blade is movably supported in the radial direction of the cylindrical substrate. The coating liquid lifted as the cylindrical substrate is lifted relative to the coating vessel at the same time when the cylindrical substrate is rotated passes through the gap to generate stress, which is utilized to keep the gap constant.

However, in such a vertical type coating method, the coating vessel and the scraping member (blade) are integrated and have a heavy weight and hence the gap between the substrate and the scraping member cannot be well controlled, which is often the cause of uneven coated layer thickness.

SUMMARY OF THE INVENTION

This invention has been achieved to overcome the above drawbacks and has an object of providing an apparatus and method for coating a coating liquid on a cylindrical member, and an apparatus and method for coating an electrophotographic photosensitive member on a cylindrical member. With the apparatus and methods, a uniform coated layer without uneven thickness can be formed, with low cost and high speed, on the peripheral surface of the cylindrical member.

The above objects of the present invention can be achieved by a coating apparatus having a coating liquid vessel for holding a coating liquid with a liquid leakage preventing member having an opening, wherein a cylindrical member to be coated is inserted into the opening, and the cylindrical member is moved in a vertical direction relative to the coating liquid vessel to coat the outer periphery of the cylindrical member with the coating liquid, and a scraping member for scraping the coating liquid, which is concentric to the cylindrical member and is at least partially immersed in the coating liquid, or is positioned above the surface of the coating liquid in coating liquid vessel, and which is movable in the radial direction of the cylindrical member provided in the coating apparatus, wherein the coating and coated layer thickness are simultaneously controlled by axially aligning by the force generated when the scraping member is brought into contact with the coating liquid due to the movement of the scraping member and the cylindrical member.

Further, when a cylindrical support for a photosensitive member is used as the cylindrical member to be coated and a coating liquid for forming the photosensitive member is used as the coating liquid, formation of a photosensitive layer and control of the layer thickness to be coated can be achieved by the above-described axial aligning operation.

DESCRIPTION OF THE PREFERRED EMBODIMENTS

The present invention will now be explained in detail.

Figure 1:
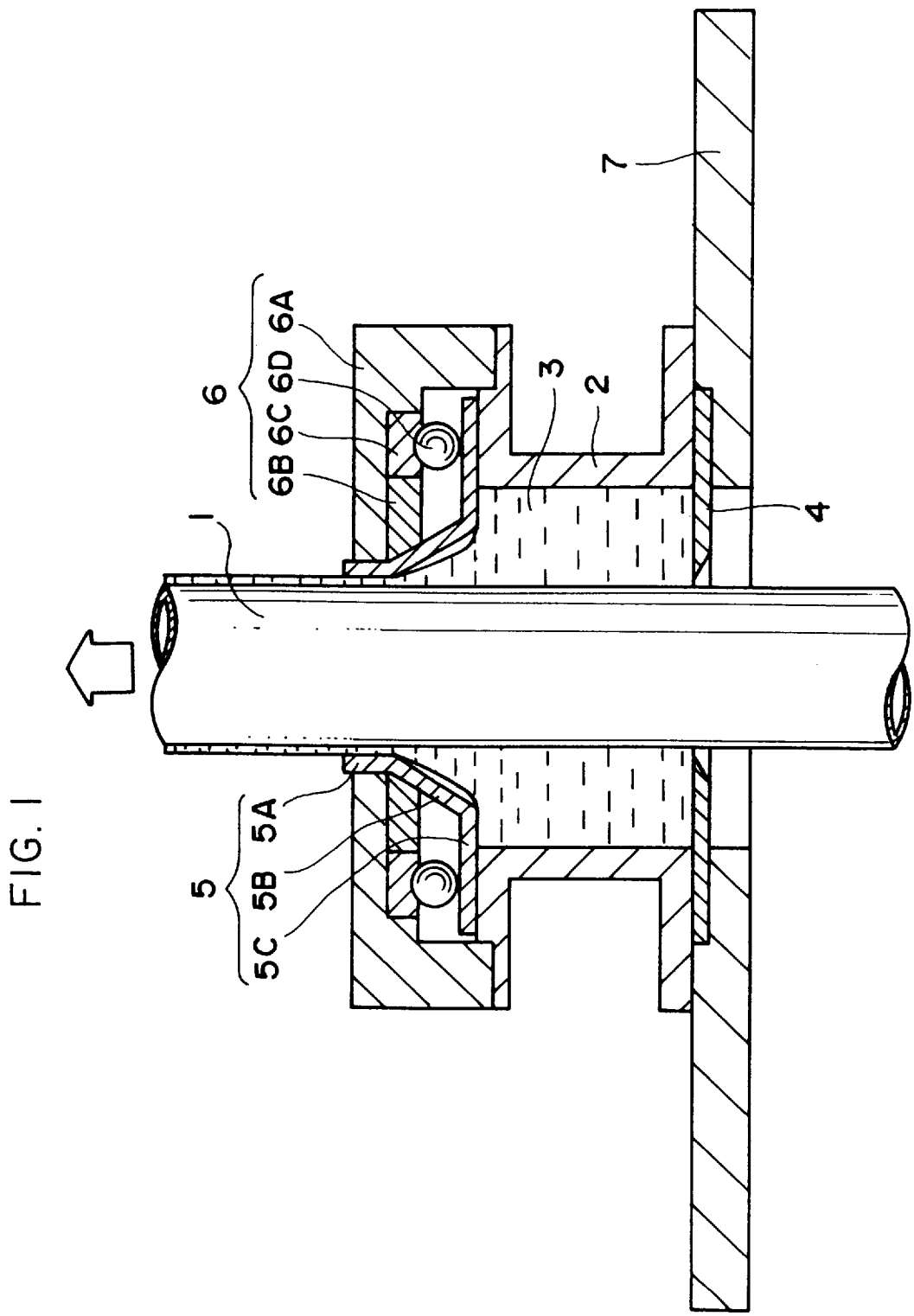
FIG. 1 is a sectional view showing a preferred embodiment of the coating apparatus of the present invention.

FIG. 1 is a sectional view showing a preferred embodiment of the coating a apparatus of the present invention.

In FIG. 1, numerals 1, 2, 3, 4, 5, 6, and 7 respectively show a cylindrical member to be coated, a coating liquid vessel, a coating liquid, packing for preventing liquid leakage, a scraping member for coating liquid, an axial aligning mechanism for the scraping member, and a pedestal for supporting a coating unit including the above members. Incidentally, a support member for the cylindrical member and a transfer means relative to the coating liquid vessel are omitted.

The coating liquid vessel 2 is secured to the upper surface of the pedestal 7, sandwiching the outer peripheral side of the packing 4 for preventing liquid leakage. The axial aligning mechanism 6 for the scraping member comprises a main body axial aligning mechanism 6A of a ring shape secured to the coating liquid vessel 2, a ring member 6B, a ring member 6C, and a bearing 6D installed in the ring member 6C. The scraping member 5 comprises a cylindrical part 5A having an inner peripheral surface parallel to the outer peripheral surface of the cylindrical member 1, an enlarged diameter portion (a tapered part) 5B which is connected to the cylindrical part 5A and whose diameter increases downwardly, and a plane part 5C connected to the tapered part 5B and disposed extending in the radial direction of the cylindrical member 1. The bearing 6D is supported with and sandwiched between the plane part 5C and the ring member 6C.

In FIG. 1, the cylindrical member 1 is moved upward in the vertical direction relative to the coating liquid vessel 2 either by lowering the pedestal 7 or by lifting the cylindrical member 1. With this operation, the coating liquid 3 held in the coating liquid vessel 2 and the packing 4 for preventing liquid leakage is allowed to adhere to the outer peripheral surface of the cylindrical member 1. The coating liquid excessively adhered to the outer peripheral surface of the cylindrical member 1 collides with the scraping member 5 made of a rigid member which is positioned on the upper side of the coating liquid vessel 2, is partially scraped, and the other part remains on the outer peripheral surface of the cylindrical member 1 to form a coated layer. When the gap between the outer peripheral surface of the cylindrical member 1 and the inner peripheral surface of the cylindrical part 5A of the scraping member 5 is uneven, liquid pressure distribution arises in the coating liquid passing through the gap. Because of this, the scraping member 5, which is movable in the horizontal direction, is axially aligned so as to make the gap constant in the radial direction of the cylindrical member 1. In this case, the cylindrical member 1 can be aligned in accordance with the viscosity of the coating liquid and the relative moving velocity of the cylindrical member 1 due to the tapered part 5B formed in the scraping member 5. Also, because the bearing 6D is assembled in the axial aligning mechanism, points of contact between the scraping member 5 and the axial aligning mechanism 6 are reduced so that the scraping member 5 can move smoothly in the horizontal direction. With the above processes, the coating liquid remaining without being scraped forms a coated layer of a constant layer thickness along the outer peripheral surface of the cylindrical member 1.

The inner diameter of the coating liquid vessel 2 is preferably more than 1.5 times, and more preferably 2 times, the outer diameter of the cylindrical member 1. If the inner diameter of the coating liquid vessel 2 is less than 1.5 times the outer diameter of the cylindrical member 1, the coating liquid 3 is influenced not only by shearing force generated by the relative movement between the cylindrical member 1 and the scraping member 5, but also by the surface tension of the coating liquid 3 at the inner surface of the coating liquid vessel 2. Hence, the coating liquid 3 does not adhere well to the cylindrical member 1, which causes the occurrence of an unacceptable phenomenon wherein parts of the cylindrical member still remain noncoated, presenting an uneven coating surface, or a desired coated layer thickness cannot be obtained.

Examples of the materials used for the cylindrical member 1 include metals such as stainless steel, aluminum, nickel, and the like; resins such as polyethylene, polypropylene, Teflon, ABS, and the like; and glass, and paper tubing, although any rigid member that can be shaped highly accurately may be used.

It is desirable that the relative moving velocity of the cylindrical member 1 to the coating liquid vessel 2 be more than one (cm/s) with a view to supplying the coating liquid in a volume exceeding the space between the cylindrical member 1 and the scraping member 5 and to apply, to the coating liquid 3, shear force which is effective in axial aligning.

Materials used for the coating liquid 3 are appropriately selected from compositions which are prepared by compounding conventionally known resins, pigments, solvents, and the like according to the object of the coating. The viscosity of the coating liquid 3 is preferably 0.5 Pa's or more, and more preferably 1 Pa's or more. Given as examples of the solvents are alcohols such as methanol, ethanol, isopropanol, butanol, and the like; aliphatic hydrocarbons such as hexane, octane, cyclohexane, and the like; aromatic hydrocarbons such as benzene, toluene, xylene, and the like; halogenated hydrocarbons such as dichloromethane, dichloroethane, carbon tetrachloride, chlorobenzene, and the like; ethers such as dimethyl ether, diethyl ether, tetrahydrofuran, ethylene glycol, and the like; ketones such as acetone, methyl ethyl ketone, anone, and the like; esters such as ethyl acetate, methyl acetate, and the like; and dimethylformaldehyde, dimethylformamide, dimethylsulfoxide, and water.

As the packing 4 for preventing liquid leakage, either a rigid member having an inner diameter slightly larger than the outer diameter of the cylindrical member 1 and also having a cylindrical part parallel to the outer surface of the cylindrical member 1, or an elastic member having an inner diameter less than the outer diameter of the cylindrical member 1 can be used. FIG. 1 shows the case where the elastic member having an inner diameter less than the outer diameter of the cylindrical member 1 is used as the packing 4 for preventing liquid leakage.

Examples of materials used as elastic members having an inner diameter less than the outer diameter of the cylindrical member 1 include industrial rubber products such as polyisoprene, butadiene/stylene copolymer, polybutadiene, polychloroprene, isobutylene/isoprene copolymer, butadiene/acrylonitril copolymer, ethylene/propylene copolymer, chlorosulfonated polyethylene, polysiloxane, propylene hexafluoride, vinylidene fluoride copolymer, polysulfide, and the like; and resin coated layers such as polyethylene, polypropylene, polyester, polycarbonate, polytetrafluoroethylene, polyamide, polyimide, and the like. The material used for the packing 4 is appropriately selected from these compounds in consideration especially of elasticity, resistance to permanent strain, and resistance to the solvent used in the coating liquid 3. The thickness of the packing 4 is in a range from 0.5 to 5 mm approximately, and preferably from 1 to 3 mm. It is desirable that the packing 4 be formed into the shape of a tapered structure so that the packing 4 will not damage the cylindrical member 1 when they contact each other.

With respect to the scraping member 5 made of a rigid member, metals, resins, ceramics, glass, or the like can be used as the rigid member. It is desirable to use a metal such as stainless steel, aluminum, or the like as the material used for the scraping member 4. Also, it is desirable that the scraping member 5 be processed by Teflon treatment after anode oxidation or Teflon treatment using an electroless plating method to smoothly put into practice the axial alignment of the scraping member 5 with the cylindrical member 1 by moving the scraping member 5.

In FIG. 1, as the scraping member 5 positioned on the upper side of the coating liquid vessel 2 and noncontacting with the coating liquid 3 before the start of coating, an elastic member having an inner diameter smaller than the outer diameter of the cylindrical member 1 may be used. In this case, the coating liquid adhering to the cylindrical member 1 collides with the scraping member 5 positioned at the upper side of the coating liquid vessel 2, made of an elastic member, thereby spreading the scraping member 5 to make a gap between the cylindrical member 1 and the scraping member 5. At this time, the scraping member 5, which is movable in the radial direction, is axially aligned by passing through the gap so that the gap is uniform along the outer periphery of the cylindrical member 1. At the same time, the coating liquid is scraped by the scraping member 5 to form a coated layer of a uniform thickness along the outer periphery of the cylindrical member 1.

Examples of the materials used for the scraping member 5, positioned on the upper portion of the coating liquid vessel 2 and noncontacting the coating liquid 3 when the operation of the cylindrical member 5 is suspended, include industrial rubber products such as polyisoprene, butadiene/stylene copolymer, polybutadiene, polychloroprene, isobutylene/isoprene copolymer, butadiene/acrylonitril copolymer, ethylene/propylene copolymer, chlorosulfonated polyethylene, polysiloxane, propylene hexafluoride, vinylidene fluoride copolymer, polysulfide, and the like; and resin coated layers such as polyethylene, polypropylene, polyester, polycarbonate, polytetrafluoroethylene, polyamide, polyimide, and the like. The material used for the scraping member 5 is appropriately selected from these compounds in consideration especially of the elasticity, the resistance to permanent strain, and resistance to the solvent used in the coating liquid 3. From these points, fluoroelastomers are especially preferable. The thickness of the scraping member 5 is appropriately determined in consideration of the relative velocity of the cylindrical member 1, viscosity of the coating liquid, elasticity of the material to be used, and target coated layer thickness.

Figure 2:
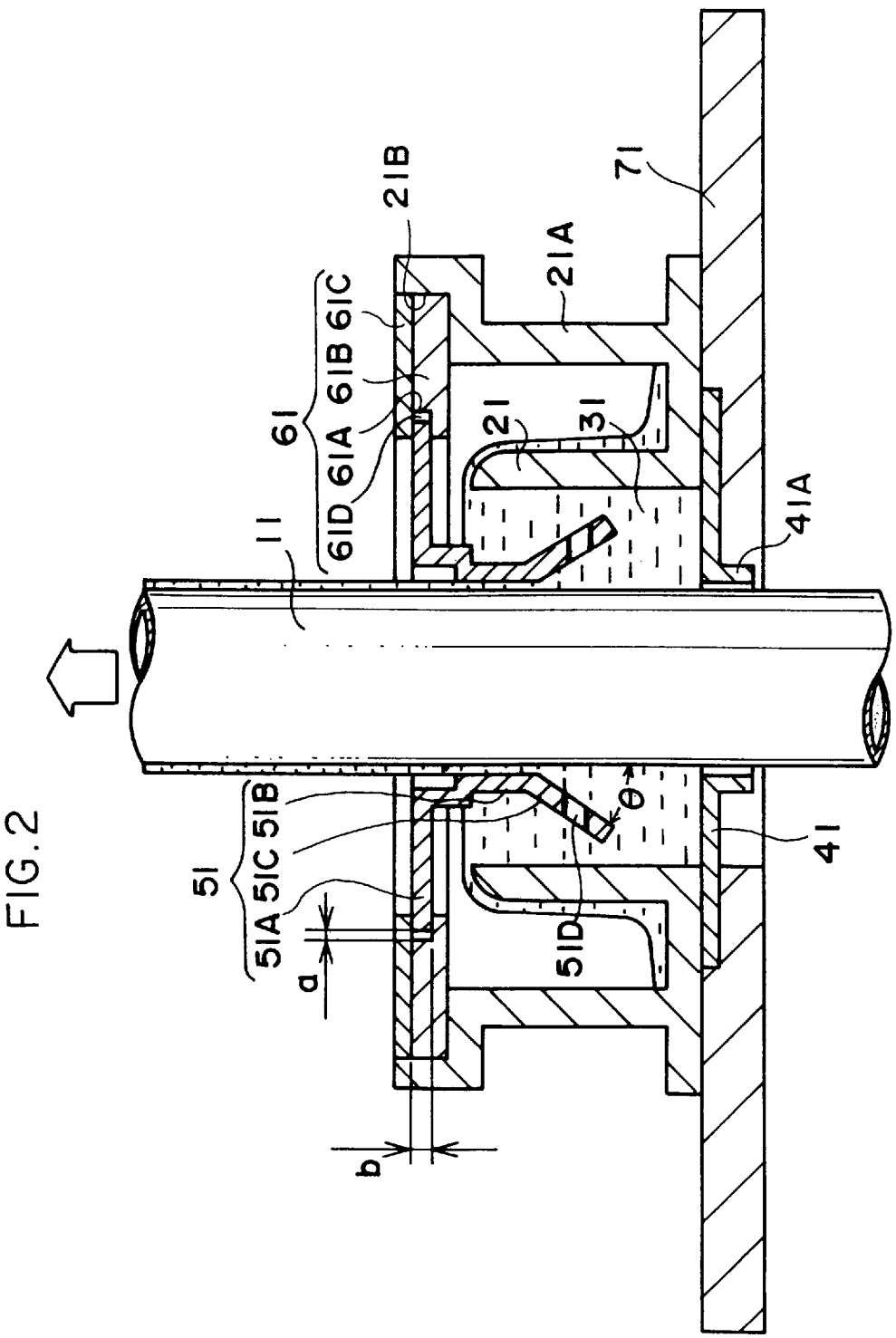
FIG. 2 is a sectional view showing an alternative preferred embodiment of the coating apparatus of the present invention.

FIG. 2 is a sectional view showing an alternative preferred embodiment of the apparatus of the present invention.

In FIG. 2, numerals 11, 21, 41, 51, 61, and 71, respectively show a cylindrical member to be coated, a coating liquid vessel for keeping a fixed liquid level of a coating liquid 31, a packing for preventing liquid leakage, a scraping member made of a rigid member, an axial aligning mechanism for the scraping member, and a pedestal for supporting a coating unit including the above members. Incidentally, support members for the cylindrical member, a transfer means relative to the coating liquid vessel, a coating liquid supply means, a coating liquid discharge means, and a rotating device of the cylindrical member are omitted.

The coating liquid vessel 21 is integrated with a support member 21A formed around thereof and secured to the upper surface of the pedestal 71, sandwiching the outer peripheral side of the packing 41 for preventing liquid leakage. The axial aligning mechanism 61 for the scraping member comprises the support member 21A with a step part 21B being formed in the upper inside of the support member 21A, a ring member 61B secured to the step part 21B and having a step part 21B, and a ring member 61C secured to the upper surface of the ring member 61B. The ring member 61B and the ring member 61C constitute a groove 61D.

The scraping member 51 consists of a ring part 51A with the outer peripheral edge thereof being inserted into the groove 61D, a cylindrical part 51B having an inner peripheral surface parallel to the outer peripheral surface of the cylindrical member 11, and an enlarged diameter part (tapered structure) 51C (tapered part) which is connected to the lower end of the cylindrical part 51B and whose diameter increases in the downward direction. The outer diameter of the ring part 51A is slightly smaller than the inner diameter of the groove 61D (diameter of the bottom of the groove).

In the tapered part 51C, plural through-holes 51D having a uniform size at equal intervals in the radial direction, are formed in the horizontal direction. The angle (shown as θ in FIG. 2) of the tapered part 51C is in a range from 30 degrees to 70 degrees, preferably from 45 degrees to 65 degrees, and more preferably from 55 degrees to 60 degrees. If the angle (θ) is less than 30 degrees, a uniformly turbulent flow of the coating liquid 31 can be hardly produced inside the tapered part 51C and hence there is a tendency for it to be difficult to perform axial alignment of the scraping member 51 with certainty. On the other hand, if the angle (θ) is more than 70 degrees, a uniformly turbulent flow of the coating liquid 31 can be hardly produced inside the tapered part 51C and hence there is a tendency for it to be difficult to perform axial alignment of the scraping member 51 with certainty in a manner similar to the above.

It is desirable that the through-holes 51D be formed at equal intervals in the radial direction. The number of through-holes 51D is preferably from 4 to 8. Illustrating the size of the through-holes 51D, if the diameter of each of the through-holes 51D is too small, the flow through the through-holes 51D is insufficient. On the other hand, if the diameter of each of the through-holes 51D is too large, a turbulent flow of the coating liquid 31 can be hardly produced and hence liquid pressure applied to the scraping member 51 does not become high, so the axial aligning function is put into practice insufficiently.

As the packing 41 for preventing liquid leakage, a rigid member having an inner diameter slightly larger than the outer diameter of the cylindrical member 11 and also having a cylindrical part parallel to the outer surface of the cylindrical member 11 can be used. If a cylindrical part (cylindrical part 41A) parallel to the external surface of the cylindrical member 11 is 5 mm or more in height and the viscosity of the coating liquid 31 is 0.5 Pa's or more, and preferably 1 Pa's or more, the coating liquid 31 can be held without leakage even if the inner diameter of the packing 41 for preventing liquid leakage is 2 mm larger than the outer diameter of the cylindrical member 11.

In FIG. 2, the cylindrical member 11 is moved upward in the vertical direction relative to the coating liquid vessel 21 either by lowering the pedestal 71 or by raising the cylindrical member 11. With this operation, the coating liquid 31 held in the coating liquid vessel 21 and the packing 41 for preventing liquid leakage is applied to the cylindrical member 11. In this case, a flow to the gap between the scraping member 51 and the cylindrical member 11 occurs inside the coating liquid 31 due to the relative movement of the cylindrical member 11. The scraping member 51 moves in the horizontal direction (radial direction) due to the liquid pressure distribution produced in the gap between the minimum diameter portion (cylindrical part 51B) of the scraping member 51 and the cylindrical member 11, allowing the gap to be uniform.

As a means for making the gap uniform, a method of rotating the cylindrical member 11 may be used. Since the tapered part 51C is located inside the coating liquid 31, stress due to rotation is readily transferred to the scraping member 51 so that the gap is uniformly distributed in an efficient manner. In order to avoid a spiral shaped uneven coated layer thickness, the revolution of the cylindrical member 11 is preferably 10 rpm or more and 300 rpm or less, more preferably in a range from 10 to 100 rpm. In addition, even if rotation is suspended just before coating, the effect on uniformity of the gap still remains.

However, in the case where the cylindrical member 11 is not allowed to rotate during the coating process for achieving some object, for example, reducing cost, if the dipped portion of the scraping member 51 inside the coating liquid 31 is sealed, the flow of the coating liquid 31 is unstable and the gap is not well controlled. Therefore, in order to control the gap stably, the scraping member 51 is provided with plural through-holes 51D oriented in the horizontal direction, each having a uniform size and formed at equal intervals in the dipped portion in the circumferential direction. with this measure, the flow of the coating liquid from the inside e to the outside of the scraping member 51 is produced. Due to such a flow of the coating liquid 31 in the horizontal direction, the scraping member 51 moves corresponding to the movement of the cylindrical member 11 so that the gap between the minimum diameter portion (cylindrical part 51B) of the scraping member 51 and the cylindrical member 11 is allowed to be uniform in the circumferential direction. If through-holes 51D are oriented in the vertical direction, the movement of the scraping member 51 becomes stable in the vertical direction. However, the gap between the minimum diameter portion (cylindrical part 51B) of the scraping member 51 and the cylindrical member 11 changes moment by moment corresponding to the relative movement of the cylindrical member 11 under the influence of bend or runout of the cylindrical member 11 at installation. Through-holes 51D in this apparatus can put their functions into practice if they are formed at an angle almost close to horizontal.

The axial aligning mechanism 61 of the scraping member is so designed that, as shown in FIG. 2, the size b of the step part 61A formed in the ring member 61B inside the axial aligning mechanism 61 is slightly larger, preferably +0.2 mm or less, than the thickness of the plane part 51A of the scraping member 51. This allows the plane part 51A of the scraping member 51 to move in the groove 61D by the gap a in the horizontal direction. As materials used for the ring member 61B and the ring member 61C, materials having high fabricating accuracy and a lower surface frictional coefficient are preferable. For example, metals such as stainless steel, aluminum, and the like, which are subjected to Teflon treatment after anode oxidation or Teflon treatment using an electroless plating method, can be used.

In order to maintain a fixed liquid level of the coating liquid in the coating liquid vessel, there is a method in which an overflow receiver and a coating liquid supply mechanism are provided outside the coating liquid vessel.

Figure 3:
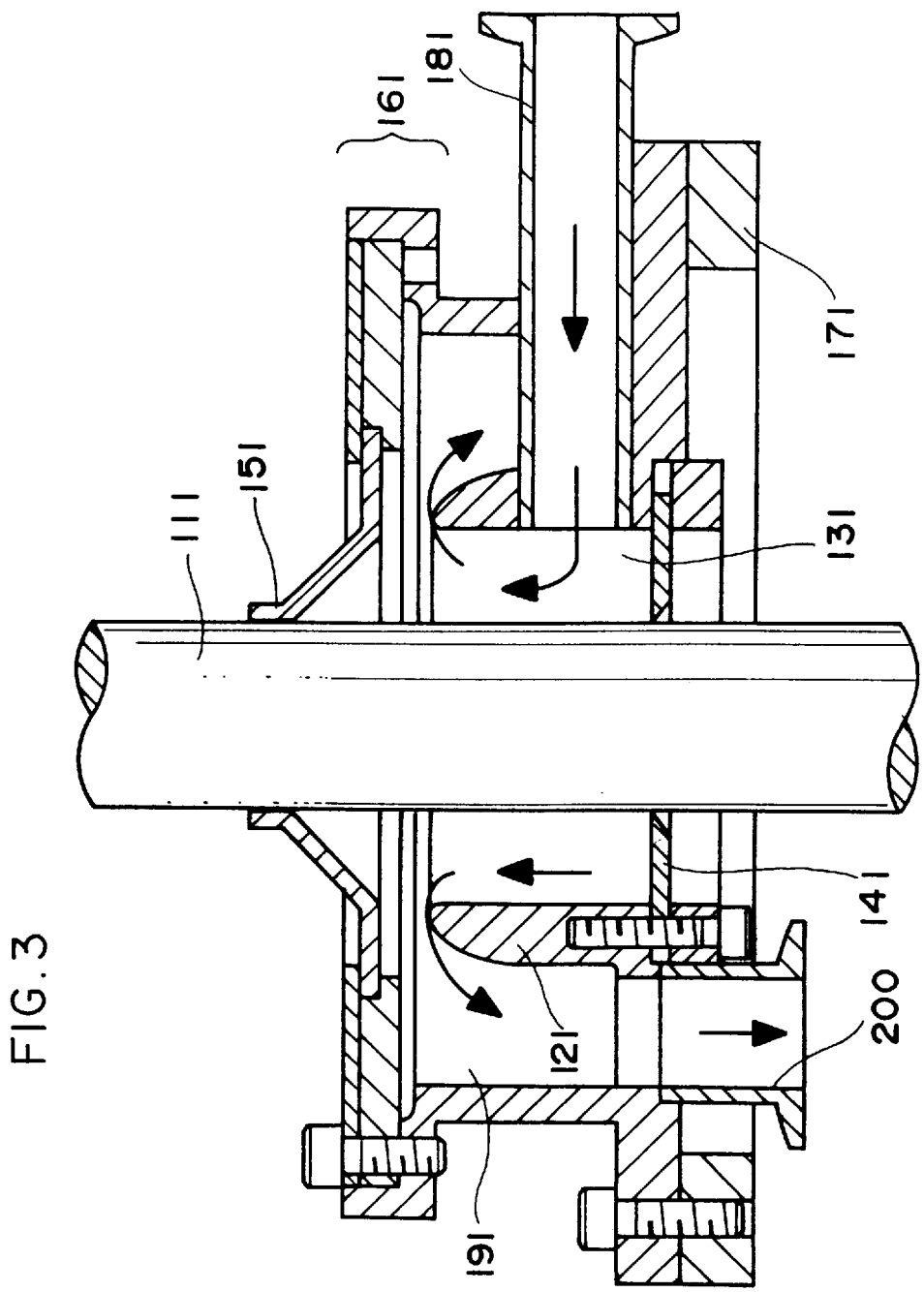
FIG. 3 is a sectional view showing another alternative preferred embodiment of the coating apparatus of the present invention.

FIG. 3 is a view showing a preferred embodiment of an apparatus provided with an overflow receiver and a coating liquid supply mechanism. In FIG. 3, the symbols 111, 121, 131, 141, 151, 161, and 171, respectively, show a cylindrical member, a coating liquid vessel, a coating liquid, a packing for preventing liquid leakage, a scraping member, an axial aligning mechanism, and a pedestal. These constitutive components are substantially the same as those shown in FIG. 2. As shown in FIG. 3, a coating liquid supply pipe 181 communicating with the coating liquid vessel 121 is installed, an overflow receiver 191 is disposed enclosing the outer periphery of the coating liquid vessel 121, and a coating liquid discharge pipe 200 communicates with the overflow receiver 191.

In this apparatus, the coating liquid 31 is supplied to the coating liquid vessel 121 through the coating liquid supply pipe 181 in an amount exceeding that of the coating liquid carried away when coating the cylindrical member 111 and the coating liquid overflowing from the coating liquid vessel 121 is externally withdrawn via the overflow receiver 191and coating liquid discharge pipe 200. With this measure, the surface of the coating liquid 31 is maintained at a fixed level relative to the coating liquid vessel.

In a method for supplying the coating liquid to the coating liquid vessel 121, it is desirable to supply a fixed amount of the coating liquid in the circumferential direction of the coating liquid vessel 121. With this method, the flow of the coating liquid is created between the outer periphery of the scraping member 151 and the inner surface of the coating liquid vessel 121, thereby promoting the alignment of the center axis of the scraping member 151, which is movable in the horizontal direction, with the center axis of the coating liquid vessel 121. This indirectly stabilizes the gap between the minimum inner diameter part of the scraping member 151 and the cylindrical member 111 along their circumference.

Figure 4:
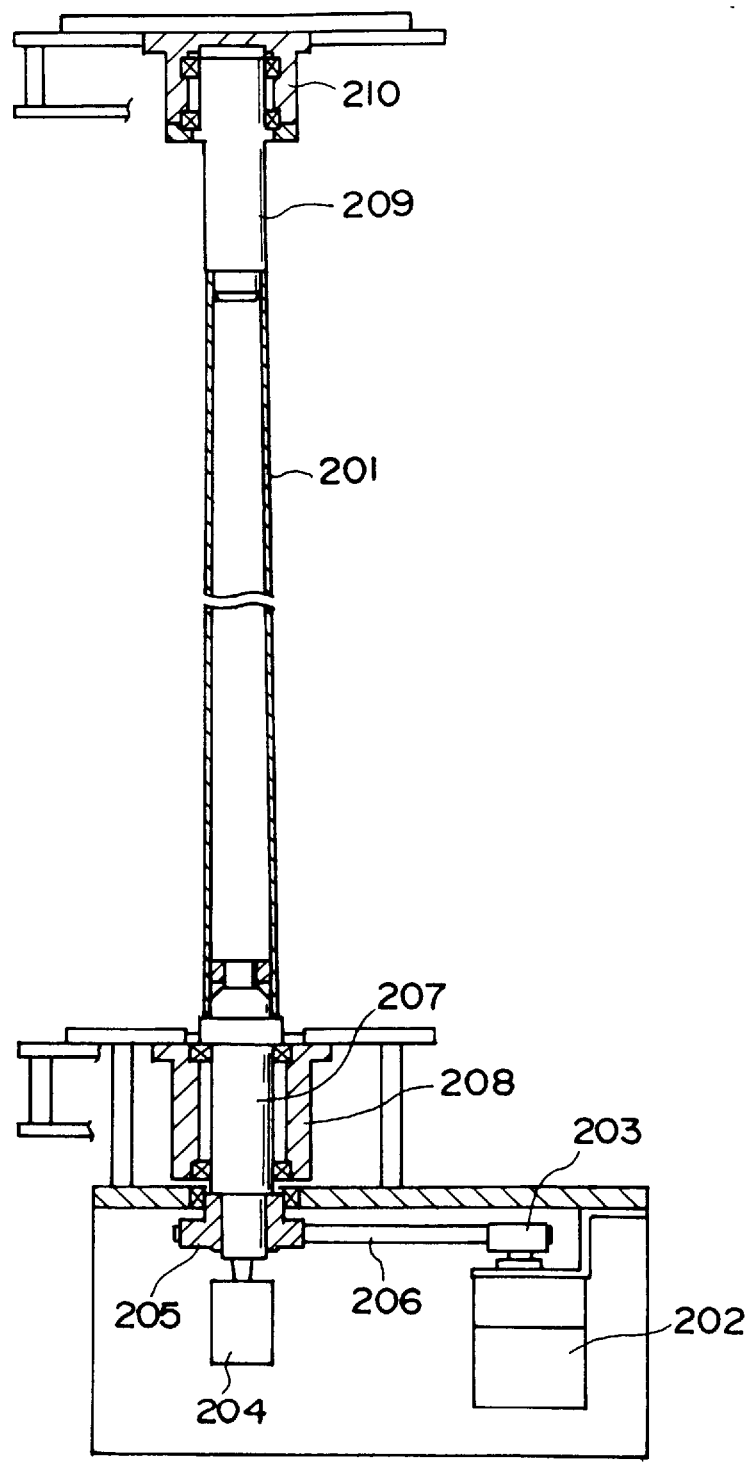
FIG. 4 is a sectional view showing a further alternative preferred embodiment of the coating apparatus of the present invention.

FIG. 4 is a view of another alternative embodiment of the coating apparatus of the present invention, schematically showing a device for rotating an elongated cylindrical member partly in section. In FIG. 4, a belt 206 is trained between a pulley 203 mounted on an AC servomotor 202 and a pulley 205 mounted on a rotary joint 204 so that the rotary motion of the AC servomotor 202 is transferred to the pulley 205. One end of a rotating member 207 in the axial direction fits in the pulley 205, the rotating member 207 is axially supported by a support member 208 through a bearing, and the other end of the rotating member 207 in the axial direction is connected with the bottom end of a cylindrical member 201 (for example, aluminum pipe) using an air chuck. Also, the top end of the cylindrical member 201 in the axial direction fits in a rotating member 209 which is axially supported by a support member 210 through a bearing. In FIG. 4, though it is not shown, for example, such an apparatus as shown in FIGS. 1 and 2 is installed around the cylindrical member 201.

In this device, such an apparatus as shown in FIGS. 1 and 2 is installed around the cylindrical member 201 so that the apparatus is movable in the upward and downward directions. Both ends of the cylindrical member 201 in the axial direction fit in the rotating members 207, 209, respectively. Under this condition, the rotating member 207 is rotated via the AC servomotor 202. With this rotational action, the cylindrical member 201 rotates and, at the same time, the apparatus moves upward or downward relative to the cylindrical member 201.

With the above operations, a desired coating layer is formed on the outer peripheral surface of the cylindrical member 201. The cylindrical member 201 on which the coating layer has been formed is removed from the rotating members 207, 208. Then, the next cylindrical member is processed in the same manner as the preceding cylindrical member 201.

Incidentally, it is permitted that the rotational action of the cylindrical member 201 be suspended just before coating and then the apparatus be moved relative to the cylindrical member 201. In this case, axial alignment is already effected by the rotating action prior to the movement of the apparatus. This is an advantage in the preparation of an objective coated layer thickness from the top edge of the coating layer.

In addition, the apparatus and method for coating of the present invention are not limited to those embodiments illustrated in FIGS. 1–4, and can be applied to, for example, a method in which a plurality of cylindrical members is relatively and continuously supplied for coating from the lower portion of the packing for preventing liquid leakage.

EXAMPLES

The present invention will be explained in more detail by way of examples, which are not intended to be limiting on the present invention.

Example 1

Using an aluminum pipe of a diameter of 30 mm and a length of 340 mm as the cylindrical member 1 and the apparatus shown in FIG. 1, a coating process was performed. As the coating liquid 3, a coating liquid produced by agitating a solution in which 100 parts by weight of polycarbonate (trade name: Iupilon Z, Z-200, manufactured by Mitsubishi Gas Chemical Co., Inc.) was dissolved in 300 parts by weight of monochlorobenzene (highest grade, manufactured by Kanto Chemical Co., Ltd. was used. The viscosity of the coating liquid 3 was approximately 3.5 Pa's at 25° C.

The inner diameter of the coating liquid vessel 2 was 60 mm. As the packing 4 for preventing liquid leakage, a soft polyethylene sheet with a thickness of 1 mm, an outer diameter of 106 mm, and an inner diameter of 29.5 mm was used. An aluminum member with an inner diameter of 30.3 mm, having a tapered structure (enlarged diameter part 5B) with a minimum diameter of 30.3 mm, a maximum diameter of 40 mm, and a taper angle of 60 degrees, and having a cylindrical part (cylindrical part 5A), whose height is 6 mm parallel to the cylindrical member 1 was used as the scraping member 5. As the axial aligning mechanism 6 for the scraping member, a mechanism having the bearing 6D shown in FIG. 1 was used.

First, as shown in FIG. 1, the cylindrical member 1 was moved upward relative to the coating liquid vessel 2 to insert the cylindrical member 1 into the coating liquid vessel 2 through the packing 4 for preventing liquid leakage. Next, under this condition, the coating liquid 3 was introduced into the coating liquid vessel 2 and the peripheral surface of the cylindrical member 1 was dipped in the coating liquid 3. The cylindrical member 1 was moved upward relative to the coating liquid vessel 2 at a velocity of 20 cm/s.

As a result, it was confirmed from visual observation that a coated layer which was uniform and had no surface discontinuity was formed on the outer peripheral surface of the cylindrical member 1. The distribution of the coated layer thickness coated on the outer periphery of the cylindrical member 1 was measured using a β-ray thickness gauge (manufactured by Fisher Co., Ltd.). The results are shown in Table 1. The proportion of standard deviation (hereinafter called "coated layer thickness unevenness") to the average values of all of the coated layer thickness data in the table is approximately 5.8%, indicating a considerable uniform coated layer thickness distribution.

TABLE 1

| Distance (mm) from start position of coating | Angle [°] | | | |
|---|---|---|---|---|
| | 0 | 90 | 180 | 270 |
| 50 | 20.55 μm | 21.04 | 20.16 | 19.08 |
| 75 | 19.27 | 21.59 | 21.69 | 20.29 |
| 100 | 19.05 | 20.18 | 22.01 | 20.39 |
| 125 | 19.04 | 20.38 | 20.72 | 20.93 |
| 150 | 18.93 | 19.59 | 22.58 | 21,02 |
| 175 | 18.93 | 20.09 | 22.82 | 20.73 |
| 200 | 18.31 | 19.55 | 21.62 | 19.64 |
| 225 | 18.03 | 20.21 | 21.75 | 21.02 |
| 250 | 18.69 | 19.73 | 20.67 | 21.02 |
| 275 | 18.80 | 20.45 | 20.93 | 22.07 |

Average coated layer thickness     20.339 μm
Standard deviation     1.175 μm

Coated layer thickness unevenness = $\dfrac{\text{Standard deviation}}{\text{Average coated layer thickness}}$     5.775%

Comparative Example 1

A coating operation was put into practice in the same manner as in Example 1 except that the axial aligning mechanism 6 for the scraping member was not used and the gap between the cylindrical member 1 and the scraping member 5 was adjusted using a clearance gauge.

As a result, a streaky coating failure extending significantly in the axial direction appeared on the peripheral surface of the cylindrical member 1. The coated layer thickness of the streak was approximately 0 μm. Also, the layer thickness unevenness calculated in the same manner as in Example 1 was as high as 50%.

Example 2

A coating operation was put into practice in the same manner as in Example 1 except that a coating liquid produced by agitating a solution in which 100 parts by weight of polycarbonate (trade name: Iupilon Z, Z-200, manufactured by Mitsubishi Gas Chemical Co., Inc.) was dissolved in 500 parts by weight of monochlorobenzene (highest grade, manufactured by Kanto Chemical Co., Ltd.) was used as the coating liquid 3. The viscosity of the coating liquid 3 was approximately 0.4 Pa's at 25° C.

As a result, it was confirmed from visual observation that a coated layer which was uniform and had no surface discontinuity was formed on the outer peripheral surface of the cylindrical member 1. However, the average coated layer thickness was lower than that of Example 1 and the coated layer thickness unevenness was 10.7%.

TABLE 2

| Distance (mm) from start position of coating | Angle [°] | | | |
|---|---|---|---|---|
| | 0 | 90 | 180 | 270 |
| 50 | 16.62 μm | 14.86 | 19.13 | 19.61 |
| 75 | 16.09 | 15.23 | 18.89 | 19.40 |
| 100 | 16.63 | 16.02 | 18.34 | 18.86 |
| 125 | 16.81 | 14.10 | 18.63 | 20.56 |
| 150 | 16.45 | 15.80 | 18.67 | 19.32 |
| 175 | 16.28 | 15.02 | 18.49 | 20.20 |
| 200 | 16.58 | 15.47 | 18.43 | 19.70 |
| 225 | 17.13 | 14.82 | 17.85 | 20.44 |
| 250 | 16.82 | 14.43 | 18.30 | 20.68 |
| 275 | 16.90 | 15.50 | 18.06 | 19.84 |
| Average coated layer thickness | 17.524 μm | | | |
| Standard deviation | 1.880 μm | | | |
| Coated layer thickness unevenness = Standard deviation / Average coated layer thickness | 10.727% | | | |

Example 3

A coating operation was put into practice in the same manner as in Example 1 except that an aluminum member having a tapered structure (enlarged diameter part 5B) with a taper angle of 60 degrees with an inner diameter of 30.3 mm, the member being tapered from 30.3 mm to 40 mm, but having no cylindrical part (cylindrical part 5A) parallel to the cylindrical member 1 was used as the scraping member 5.

As a result, it was confirmed from visual observation that a coated layer which was uniform and had no surface discotinuity was formed on the outer peripheral surface of the cyclindrical member 1. However, as shown in Table 3, the coated layer thickness unevenness was 8.2%, which was that of Example 1.

TABLE 3

| Distance (mm) from start position of coating | Angle [°] | | | |
|---|---|---|---|---|
| | 0 | 90 | 180 | 270 |
| 50 | 19.88 μm | 21.08 | 21.02 | 19.07 |
| 75 | 18.35 | 21.64 | 22.34 | 20.25 |
| 100 | 18.04 | 20.21 | 22.72 | 20.35 |
| 125 | 18.04 | 20.46 | 21.68 | 20.86 |
| 150 | 17.86 | 20.00 | 23.12 | 21.09 |
| 175 | 17.87 | 20.04 | 23.08 | 20.68 |
| 200 | 17.45 | 19.56 | 22.44 | 20.21 |
| 225 | 17.20 | 20.13 | 22.55 | 21.15 |
| 250 | 17.59 | 19.68 | 21.51 | 21.10 |
| 275 | 17.66 | 20.56 | 21.77 | 21.55 |
| Average coated layer thickness | 20.296 μm | | | |
| Standard deviation | 1.669 μm | | | |
| Coated layer thickness unevenness = Standard deviation / Average coated layer thickness | 8.224% | | | |

Example 4

A coating operation was put into practice in the same manner as in Example 1 except that Chemrats 504 fluoroelastomer: manufactured by Green, Tweed & Co., Japan) with inner diameter of 29.7 mm and a thickness of 1 mm the scraping member 5. The scraping member 5 was used under the condition that it was sandwiched with a ring-shape stainless steel package with an inner diameter of 60 mm and a thickness of 1 mm.

As a result, it was confirmed from visual observation that a coated layer which was uniform and had no surface discontinuity was formed on the outer peripheral surface of the cyclindrical member 1. As shown in Table 4, the coated layer thickness unevenness was approximately 7.8%.

TABLE 4

| Distance (mm) from start position of coating | Angle [°] | | | |
|---|---|---|---|---|
| | 0 | 90 | 180 | 270 |
| 50 | 10.15 μm | 11.11 | 12.04 | 10.43 |
| 75 | 10.69 | 12.48 | 12.27 | 9.46 |
| 100 | 10.51 | 11.26 | 12.72 | 10.75 |
| 125 | 10.44 | 11.00 | 11.97 | 10.22 |
| 150 | 11.70 | 11.23 | 11.19 | 11.34 |
| 175 | 12.18 | 11.07 | 10.77 | 10.00 |
| 200 | 12.42 | 10.95 | 10.66 | 10.96 |
| 225 | 12.20 | 10.66 | 11.04 | 10.05 |
| 250 | 11.75 | 12.19 | 11.03 | 9.24 |
| 275 | 12.06 | 11.56 | 10.86 | 9.67 |
| Average coated layer thickness | 11.107 μm | | | |
| Standard deviation | 0.865 μm | | | |
| Coated layer thickness unevenness = Standard deviation / Average coated layer thickness | 7.789% | | | |

Example 5

A coating operation was put into practice in the same manner Example 1 except that Chemrats 505 fluoroelastomer: manufactured by Green, Tweed & Co., Japan) with an inner diameter of 28.5 mm and a thickness of 3 mm, having a tapered structure (enlarged diameter part 5B) tapered from a minimum diameter of 28.5 mm to a maximum diameter of 40 mm, was used as the scraping member 5 and the relative moving velocity of the cylindrical member 1 was 65 cm/s. The scraping member 5 was used under the condition that it was sandwiched with a stainless steel package with an inner diameter of 60 mm and a thickness of 1 mm. As a result, it was confirmed from visual observation that a coated layer which was uniform and had no surface discountinuity was formed on the outer peripheral surface of the cyclindrical member 1. As shown in Table 5, the coated layer thickness unevenness was approximately 6.6%.

TABLE 5

| Distance (mm) from start position of coating | Angle [°] | | | |
|---|---|---|---|---|
| | 0 | 90 | 180 | 270 |
| 50 | 27.79 μm | 27.75 | 24.19 | 25.98 |
| 75 | 27.72 | 25.43 | 26.64 | 24.69 |
| 100 | 27.33 | 24.46 | 25.15 | 23.37 |
| 125 | 26.14 | 23.61 | 23.08 | 23.49 |
| 150 | 25.14 | 22.77 | 23.46 | 25.34 |
| 175 | 27.72 | 22.65 | 23.53 | 22.99 |
| 200 | 27.72 | 25.66 | 22.99 | 24.47 |
| 225 | 27.72 | 24.69 | 23.76 | 23.02 |
| 250 | 25.12 | 25.71 | 26.27 | 23.87 |
| 275 | 27.06 | 26.56 | 25.54 | 25.65 |
| Average coated layer thickness | 25.156 μm | | | |
| Standard deviation | 1.652 μm | | | |
| Coated layer thickness unevenness = Standard deviation / Average coated layer thickness | 6.568% | | | |

Example 6

Using an aluminum pipe with a diameter of 30 mm and a length of 340 mm as a cylindrical member 11 and the apparatus shown in FIG. 2, a coating process was performed. As the coating liquid 31, a coating liquid produced by agitating a solution in which 100 parts by weight of polycarbonate (trade name: Iupilon Z. Z-200, manufactured by Mitsubishi Gas Chemical Co., Inc.) was dissolved in 300 parts by weight of monochlorobenzene (highest grade, manufactured by Kanto Chemical Co., Ltd.) was used. The viscosity of the coating liquid 31 was approximately 3.5 Pa's at 25° C.

The inner diameter of the coating liquid vessel 21 was 60 mm. A stainless steel material with an inner diameter of 31 mm and with the height of the cylindrical part parallel to the outer surface of the cylindrical member 11 being 10 mm was used as the packing 41 for preventing liquid leakage.

An aluminum member with an inner diameter of 30.3 mm, having a 60-degree tapered structure (enlarged diameter part 51C) tapered from a minimum diameter of 30.3 mm to a maximum diameter of 54 mm, and having a cylindrical part (cylindrical part 51B), whose height is 6 mm parallel to the cylindrical member 11 was used as the scraping member 51. The surface of the scraping member 51 was subjected to an anode oxidation treatment, followed by a Teflon coating treatment. The apparatus was assembled under the condition that the entire tapered part 51C and 3 mm in height of the cylindrical part (cylindrical part 51B) from the bottom thereof were dipped into the coating liquid. The scraping member 51 was provided with four through-holes 51D of 7 mm in diameter, which were horizontally oriented in the tapered part (enlarged diameter part 51C) at a 5-mm distance from the lowest part of the tapered part and which were positioned at 90-degree intervals along the circumference of the tapered part. In addition, the size b was 3.1 mm.

First, as shown in FIG. 2, the cylindrical member 11 was moved upward relative to the coating liquid vessel 21 to insert the cylindrical member 11 into the coating liquid 31 through the packing 41 for preventing liquid leakage. Next, under this condition, the coating liquid 31 was continuously introduced into the coating liquid vessel 21 at a rate of 20 mm³/s. The cylindrical member 11 was moved upward at a velocity of 20 cm/s relative to the coating liquid vessel 21.

As a result, it was confirmed from visual observation that a coated layer which was uniform and had no surface discontinuity was formed on the outer peripheral surface of the cylindrical member 11. The distribution of the coated layer thickness coated on the outer periphery of the cylindrical member 1 was measured. The results are shown in Table 6. The coated layer thickness unevenness was approximately 3.6%, indicating a considerable uniform coated layer thickness distribution.

TABLE 6

| Distance (mm) from start position of coating | Angle [°] | | | |
|---|---|---|---|---|
| | 0 | 90 | 180 | 270 |
| 50 | 20.89 μm | 22.02 | 20.16 | 19.06 |
| 75 | 20.27 | 21.04 | 21.44 | 20.22 |
| 100 | 20.06 | 20.06 | 21.35 | 20.23 |
| 125 | 20.05 | 20.26 | 21.11 | 20.83 |
| 150 | 20.00 | 19.87 | 21.64 | 21.00 |
| 175 | 19.98 | 20.09 | 21.56 | 20.68 |
| 200 | 19.50 | 19.86 | 21.78 | 20.77 |
| 225 | 19.54 | 20.12 | 21.64 | 20.54 |
| 250 | 19.76 | 19.69 | 21.00 | 20.96 |
| 275 | 19.90 | 20.35 | 20.93 | 21.99 |

TABLE 6-continued

| Distance (mm) from start position of coating | Angle [°] | | | |
|---|---|---|---|---|
| | 0 | 90 | 180 | 270 |
| Average coated layer thickness | | 20.558 μm | | |
| Standard deviation | | 0.741 μm | | |
| Coated layer thickness unevenness = Standard deviation / Average coated layer thickness | | 3.603% | | |

Example 7

A coating operation was put into practice in the same manner as in Example 6 except that a scraping member provided with no through-holes was used as the scraping member 51.

As a result, it was confirmed from visual observation that a coated ed layer which was uniform and had no surface discontinuity was formed on the outer peripheral surface of the cyclindrical member 11. As shown in Table 7, the coated layer thickness unevenness was approximately 16.0%.

TABLE 7

| Distance (mm) from start position of coating | Angle [°] | | | |
|---|---|---|---|---|
| | 0 | 90 | 180 | 270 |
| 90 | 21.20 μm | 18.56 | 14.82 | 19.26 |
| 110 | 20.00 | 20.39 | 16.15 | 18.25 |
| 160 | 18.73 | 20.87 | 18.64 | 16.85 |
| 210 | 19.07 | 21.76 | 18.14 | 14.62 |
| 260 | 18.13 | 23.26 | 18.81 | 14.84 |
| 310 | 17.36 | 22.89 | 19.11 | 13.20 |
| 360 | 16.45 | 22.23 | 19.26 | 13.59 |
| 410 | 16.88 | 22.77 | 20.37 | 14.01 |
| 460 | 16.65 | 23.21 | 20.76 | 13.74 |
| 510 | 17.18 | 22.87 | 19.97 | 13.54 |
| Average coated layer thickness | | 18.460 μm | | |
| Standard deviation | | 2.957 μm | | |
| Coated layer thickness unevenness = Standard deviation / Average coated layer thickness | | 16.016% | | |

Example 8

A coating operation was put into practice in the same manner is in Example 4 except that the flow of the coating liquid 31 suspended just before the cylindrical member was moved.

As a result, it was confirmed from visual observation that a coated layer which was uniform and had no surface discontinuity was formed on the outer peripheral surface of the cyclindrical member 1. As shown in Table 8, the coated layer thickness unevenness was approximately 4.2%, which was inferior that of Example 6.

TABLE 8

| Distance (mm) from start position of coating | Angle [°] | | | |
|---|---|---|---|---|
| | 0 | 90 | 180 | 270 |
| 50 | 21.43 μm | 22.58 | 19.46 | 18.64 |
| 75 | 20.65 | 21.73 | 20.37 | 19.52 |
| 100 | 19.97 | 20.58 | 21.11 | 20.04 |
| 125 | 19.88 | 20.44 | 20.86 | 20.35 |

TABLE 8-continued

| Distance (mm) from start position of coating | Angle [°] | | | |
|---|---|---|---|---|
| | 0 | 90 | 180 | 270 |
| 150 | 19.88 | 20.10 | 21.52 | 20.86 |
| 175 | 19.80 | 20.15 | 21.47 | 20.46 |
| 200 | 19.60 | 19.95 | 21.80 | 20.57 |
| 225 | 19.32 | 20.24 | 21.59 | 20.31 |
| 250 | 19.36 | 19.96 | 21.20 | 21.20 |
| 275 | 19.47 | 20.99 | 21.00 | 22.00 |
| Average coated layer thickness | 20.510 $\mu$m | | | |
| Standard deviation | 0.85912 $\mu$m | | | |
| Coated layer thickness unevenness = $\frac{\text{Standard deviation}}{\text{Average coated layer thickness}}$ | 4.18873% | | | |

Example 9

Using an aluminum pipe of a diameter of 30 mm and a length of 340 mm as a cylindrical member 11 and the apparatus shown in FIG. 2, a coating process was performed. As the coating liquid 31, a coating liquid produced by agitating a solution in which 100 parts by weight of polycarbonate (trade name: Iupilon Z, Z-200, manufactured by Mitsubishi Gas Chemical Co., Inc.) was dissolved in 100 parts by weight of monochlorobenzene (manufactured by Kanto Chemical Co., Ltd.) was used. The viscosity of the coating liquid 31 was approximately 3.5 mPa's at 20° C.

The inner diameter of the coating liquid vessel 21 was 60 mm. A stainless steel member with an inner diameter of 31 mm and with the height of a cylindrical part parallel to the outer surface of the cylindrical member 11 being 10 mm was used as the packing 41 for preventing liquid leakage.

An aluminum member with an inner diameter of 30.3 mm, having a 60-degree tapered structure (enlarged diameter part 51C), tapered from a minimum diameter of 30.3 mm to a maximum diameter of 54 mm, and having a cylindrical part (cylindrical part 51B), whose height is 6 mm parallel to the cylindrical member 11 was used as the scraping member 51. The surface of the scraping member 51 was subjected to an anode oxidation treatment, followed by a Teflon coating treatment. The apparatus was assembled under the condition that the entire tapered part 51C and 3 mm in height of the cylindrical part from the bottom (cylindrical part 51B) were dipped into the coating liquid. The scraping member 51 was provided with four through-holes 51D of 7 mm in diameter, which were oriented in the vertical direction in the tapered part (enlarged diameter part 51C) at a 5-mm distance from the lowest part of the tapered part and which were positioned at 90-degree intervals along the circumference of the tapered part. In addition, the size b was 3.1 mm.

First, as shown in FIG. 2, the cylindrical member 11 was moved upward relative to the coating liquid vessel 21 to insert the cylindrical member 11 into the coating liquid 31 through the packing 41 for preventing liquid leakage. Next, under this condition, the coating liquid 31 was continually introduced into the coating liquid vessel 21 at a rate of 20 mm³/s. The cylindrical member 11 was moved upward at a velocity of 20 cm/s relative to the coating liquid vessal 21.

As a result, it was confirmed from visual observation that a coated layer which was uniform and had no surface discontinuity was formed on the outer peripheral surface of the cyclindrical member 11. The distribution of the coated layer thickness coated on the outer periphery of the cyclindrical member 1 was measured. The results are shown in Table 9. The coated layer thickness unevenness was approximately 11.5%.

TABLE 9

| Distance (mm) from start position of coating | Angle [°] | | | |
|---|---|---|---|---|
| | 0 | 90 | 180 | 270 |
| 50 | 22.20 $\mu$m | 18.36 | 16.33 | 21.26 |
| 75 | 21.00 | 20.19 | 17.65 | 20.25 |
| 100 | 19.73 | 20.67 | 17.64 | 18.85 |
| 125 | 20.07 | 20.56 | 19.14 | 16.88 |
| 150 | 19.13 | 22.26 | 19.81 | 16.84 |
| 175 | 18.36 | 22.49 | 20.11 | 16.20 |
| 200 | 18.00 | 22.03 | 20.26 | 15.59 |
| 225 | 17.88 | 22.57 | 21.17 | 16.01 |
| 250 | 17.65 | 23.21 | 21.26 | 15.74 |
| 275 | 18.17 | 22.67 | 20.97 | 15.54 |
| Average coated layer thickness | 19.368 $\mu$m | | | |
| Standard deviation | 2.22766 $\mu$m | | | |
| Coated layer thickness unevenness = $\frac{\text{Standard deviation}}{\text{Average coated layer thickness}}$ | 11.5021% | | | |

Example 10

Using an aluminum pipe with a diameter of 30 mm and a length of 340 mm as a cylindrical member 11 and the apparatus shown in FIG. 2, a coating process was performed. As the coating liquid 31, a coating liquid produced by agitating a solution in which 18 parts by weight of polycarbonate (trade name: Iupilon Z, Z-200, manufactured by Mitsubishi Gas Chemical Co., Inc.) and 12 parts by weight of a charge transfer agent (N,N'-diphenyl-N,N'-bis(3-methylphenyl)4,4-diamine)-4,4-diamine) were dissolved in 70 parts by weight of monochlorobenzene (manufactured by Kanto Chemical Co., Ltd.) was used. The viscosity of the coating liquid 31 was approximately 1.0 mPa's at 20° C.

The inner diameter of the coating liquid vessel 21 was 60 mm. A stainless steel material with an inner diameter of 31 mm and with the height of a cylindrical part parallel to the outer surface of the cylindrical member 11 being 10 mm was used as the packing 41 for preventing liquid leakage.

An aluminum member with an inner diameter of 30.3 mm, having a 60-degree tapered structure (enlarged diameter part 51C) tapered from a minimum diameter of 30.3 mm to a maximum diameter of 54 mm, and having a cylindrical part (cylindrical part 51B), whose height is 6 mm parallel to the cylindrical member 11 was used as the scraping member 51. The surface of the scraping member 51 was subjected to an anode oxidation treatment, followed by a Teflon coating treatment. The apparatus was assembled under the condition that the entire tapered part 51C and 3 mm in height of the cylindrical part (cylindrical part 51B) were dipped into the coating liquid. The scraping member 51 was provided with four through-holes 51D of 7 mm in diameter, which were horizontally oriented in the tapered part (enlarged diameter part 51C) at a 5 mm distance from the lowest part of the tapered part and which were positioned at 90-degree intervals along the circumference of the tapered part. In addition, the size b was 3.1 mm.

First, as shown in FIG. 2, the cylindrical member 11 was moved upward relative to the coating liquid vessel 21 to insert the cylindrical member 11 into the coating liquid 31 through the packing 41 for preventing liquid leakage. Next, under this condition, the coating liquid 31 was continuously introduced into the coating liquid vessel 21 at a rate of 20 mm³/s. The cylindrical member 11 was moved upward at a velocity of 20 cm/s relative to the coating liquid vessel 21.

As a result, it was confirmed from visual observation that a coated layer which was uniform and had no surface discontinuity was formed on the outer peripheral surface of the cylindrical member 11. The distribution of the coated layer thickness coated on the outer periphery of the cylindrical member 11 was measured. The results are shown in Table 10. The coated layer thickness unevenness was approximately 3.0%.

TABLE 10

| Distance (mm) from start position of coating | Angle [°] | | | |
|---|---|---|---|---|
| | 0 | 90 | 180 | 270 |
| 50 | 25.09 μm | 26.08 | 24.30 | 23.16 |
| 75 | 24.31 | 24.48 | 25.67 | 24.28 |
| 100 | 24.06 | 24.25 | 25.45 | 24.29 |
| 125 | 24.07 | 24.30 | 25.35 | 24.91 |
| 150 | 24.01 | 23.97 | 25.36 | 25.11 |
| 175 | 24.01 | 24.21 | 25.78 | 24.72 |
| 200 | 23.50 | 23.99 | 25.97 | 24.89 |
| 225 | 23.44 | 24.28 | 25.78 | 24.73 |
| 250 | 23.56 | 23.63 | 24.99 | 24.99 |
| 275 | 23.98 | 24.48 | 24.88 | 25.08 |

| | |
|---|---|
| Average coated layer thickness | 24.585 μm |
| Standard deviation | 0.73584 μm |
| Coated layer thickness unevenness = Standard deviation / Average coated layer thickness | 2.99309% |

Example 11

Using an aluminum pipe with a diameter of 30 mm and a length of 340 mm as a cylindrical member 11 and the apparatus shown in FIG. 2, a coating process was performed. As the liquid 31, a coating liquid produced by agitating a solution in which 100 parts by weight of polycarbonate, (trade name: Iupilon Z, Z-200, manufactured by Mitsubishi Gas Chemical Co., Inc.) was dissolved in 300 parts by weight of monochlorobenzene (highest grade, manufactured by Kanto Chemical Co., Ltd.) was used. The viscosity of the coating liquid 31 was approximately 3.5 Pa's at 20° C.

The inner diameter of the coating liquid vessel 21 was 60 mm. A stainless steel member with an inner diameter of 31 mm and with the height of a cylindrical part parallel to the outer surface of the cylindrical member 11 being 10 mm was used as the packing 41 for preventing liquid leakage.

An aluminum member with an inner diameter of 30.3 mm, having a 60-degree tapered structure (enlarged diameter part 51C) tapered from a minimum diameter of 30.3 mm to a maximum diameter of 54 mm, and having a cylindrical part (cylindrical part 51B), whose height is 6 mm, parallel to the cylindrical member 11 was used as the scraping member 51. The surface of the scraping member 51 was subjected to an anode oxidation treatment, followed by a Teflon coating treatment. The tapered structure (enlarged diameter part 51C) was a sealed structure without any through-hole. The apparatus was assembled under the condition that the entire tapered part 51C and 3 mm in height of the cylindrical part (cylindrical part 51B) were dipped into the coating liquid.

As the axial aligning mechanism 61 for the scraping member, as shown in FIG. 2, a member having the function of interposing the scraping member 51 between the ring members 61B and 61C installed inside the axial aligning mechanism 61 was used. In addition, the size b was 3.1 mm. As a member for the axial aligning mechanism 61, an aluminum member processed by an anode oxidation treatment and a Teflon coating treatment was used.

First, as shown in FIG. 2, the cylindrical member 11 was moved upward relative to the coating liquid vessel 21 to insert the cylindrical member 11 into the coating liquid 31 through the packing 41 for preventing liquid leakage. Next, under this condition, the coating liquid 31 was continuously introduced into the coating liquid vessel 21 at a rate of 20 mm³/s. The cylindrical member 11 was moved upward at a velocity of 20 cm/s relative to the coating liquid vessel 21 while rotating the cylindrical member 11 at 100 rpm using such a rotation device as shown in FIG. 4.

As a result, it was confirmed from visual observation that a coated layer which was uniform and had no surface discontinuity was formed on the outer peripheral surface of the cylindrical member 11. The distribution of the coated layer thickness coated on the outer periphery of the cylindrical member 11 was measured. The results are shown in Table 11. The coated layer thickness unevenness was approximately 2.8%.

TABLE 11

| Distance (mm) from start position of coating | Angle [°] | | | |
|---|---|---|---|---|
| | 0 | 90 | 180 | 270 |
| 50 | 20.75 μm | 20.01 | 21.00 | 21.11 |
| 75 | 21.32 | 19.80 | 19.88 | 21.22 |
| 100 | 21.01 | 20.77 | 20.55 | 20.49 |
| 125 | 20.99 | 20.66 | 19.79 | 20.45 |
| 150 | 21.20 | 20.50 | 19.50 | 20.69 |
| 175 | 20.63 | 19.80 | 19.77 | 21.32 |
| 200 | 21.25 | 20.44 | 19.50 | 21.05 |
| 225 | 20.88 | 20.13 | 20.12 | 20.37 |
| 250 | 20.86 | 20.22 | 19.90 | 19.57 |

| | |
|---|---|
| Average coated layer thickness | 20.440 μm |
| Standard deviation | 0.57664 μm |
| Coated layer thickness unevenness = Standard deviation / Average coated layer thickness | 2.82122% |

Example 12

A coating operation was put into practice in the same manner as in Example 11 except that, using the scraping member 51 provided with four through-holes 51D of 7 mm in diameter, which were horizontally oriented in the tapered part (enlarged diameter part 51C), formed at a 5-mm distance from the lowest part of the tapered part, and positioned at 90-degree intervals along the circumference of the tapered part, and the cylindrical member 11 was rotated at 300 rpm, then the rotation was suspended, and the cyclindrical member 11 was moved relative to the coating liquid vessel 21.

As a result, it was confirmed from visual observation that a coated layer which was uniform and had no surface discontinuity was formed on the outer peripheral surface of the cylindrical member 11. The distribution of the coated layer thickness coated on the outer periphery of the member 11 was measured. The results are shown in Table 12. The coated layer thickness unevenness was approximately 3.0%.

TABLE 12

| Distance (mm) from start position of coating | Angle [°] | | | |
|---|---|---|---|---|
| | 0 | 90 | 180 | 270 |
| 50 | 20.67 μm | 21.52 | 20.02 | 19.15 |
| 75 | 20.15 | 21.06 | 21.15 | 20.10 |
| 100 | 20.14 | 20.28 | 21.09 | 20.63 |
| 125 | 19.98 | 20.15 | 21.08 | 20.51 |
| 150 | 19.94 | 19.75 | 21.53 | 20.32 |
| 175 | 19.91 | 19.87 | 21.24 | 20.31 |
| 200 | 19.45 | 19.88 | 21.45 | 20.50 |
| 225 | 19.68 | 19.80 | 21.33 | 20.38 |
| 250 | 19.71 | 19.78 | 20.84 | 20.65 |
| 275 | 19.74 | 20.11 | 20.82 | 20.97 |
| Average coated layer thickness | 20.391 μm | | | |
| Standard deviation | 0.61654 μm | | | |
| Coated layer thickness unevenness = Standard deviation / Average coated layer thickness | 3.02359% | | | |

As is clear from the above illustrations, a coated layer, such as a photosensitive layer, having a uniform coated layer thickness without thickness unevenness can be formed on the outer periphery of the cylindrical member such as an electrophotographic photosensitive member at a high production rate at low cost.

What is claimed is:

1. A coating apparatus having a coating liquid vessel for holding a coating liquid with a liquid leakage preventing member having an opening, wherein a cylindrical member to be coated is inserted into the opening, and the cylindrical member is moved in a vertical direction relative to the coating liquid vessel to coat the outer periphery of the cylindrical member with the coating liquid, and a scraping member movable in a radial direction relative to said coating liquid vessel, said scraping member for scraping the coating liquid, said scraping member is concentric to the cylindrical member and is at least partially immersed in the coating liquid, or is positioned above the surface of the coating liquid in the coating liquid vessel, and said scraping member movable in the radial direction of the cylindrical member provided in the coating apparatus.

2. A coating apparatus according to claim 1, wherein the scraping member has a scraping portion having an inner diameter part slightly larger than the outer diameter of the cylindrical member, the scraping portion being located at a position higher than the liquid surface of the coating liquid.

3. A coating apparatus according to claim 2, wherein the scraping portion is a cylindrical body having an inner peripheral surface parallel to the outer peripheral surface of the cylindrical member.

4. A coating apparatus according to claim 2, wherein the scraping member is composed of a rigid member.

5. A coating apparatus according to claim 3, wherein the scraping member is composed of a rigid member.

6. A coating apparatus according to claim 1, wherein the scraping member is composed of an elastic member having a scraping portion having an inner diameter equal to, or smaller than, the outer diameter of the cylindrical member.

7. A coating apparatus according to claim 1, wherein the scraping member has a scraping portion having an inner diameter larger than the outer diameter of the cylindrical member, a part or an entirety of the scraping portion being dipped in the coating liquid.

8. A coating apparatus according to claim 7, wherein the scraping portion has a tapered portion tapered in such a manner that the inner diameter of the scraping portion is enlarged downwardly.

9. A coating apparatus according to claim 8, the tapered portion is provided with a plurality of through-holes in the horizontal direction at equal intervals along the circumference of the tapered portion.

10. A coating apparatus according to claim 3, wherein the scraping portion comprises a cylindrical body having an inner peripheral surface parallel to the outer peripheral surface of the cylindrical member to be coated thereon, and a tapered portion tapered in such a manner that the inner diameter of the scraping portion is enlarged downwardly.

11. A coating apparatus according to claim 1, wherein the liquid leakage preventing member is composed of a rigid member having a cylindrical part having an inner diameter slightly larger than the outer diameter of the cylindrical member and an inner peripheral surface parallel to the cylindrical member.

12. A coating apparatus according to claim 1, wherein the coating liquid vessel is concentric to the cylindrical member and the inner diameter of the vessel is more than 1.5 times the outer diameter of the cylindrical member.

13. A coating apparatus according to claim 1, wherein the scraping member has a surface subjected to a treatment for improving the smoothness thereof.

14. A coating apparatus according to claim 7, wherein the coating apparatus includes a drive mechanism for rotating the cylindrical member.

15. A coating apparatus according to claim 8, wherein the coating apparatus includes a drive mechanism for rotating the cylindrical member.

16. A coating apparatus according to claim 9, wherein the coating apparatus includes a drive mechanism for rotating the cylindrical member.

17. A coating apparatus according to claim 10, wherein the coating apparatus includes a drive mechanism for rotating the cylindrical member.

18. A method for coating a coating liquid on an outer peripheral surface of a cylindrical member in a coating liquid vessel for holding the coating liquid therein, equipped with a liquid leakage preventing member having an opening, comprising the steps of:

inserting the cylindrical member into the opening;

moving the cylindrical member in the vertical direction relative to the coating liquid vessel; and moving the cylindrical member to a radial direction thereof while axially aligning a scraping member movable in a radial direction relative to said coating liquid vessel which is at least partially immersed in the coating liquid, or is positioned above the surface of the coating liquid in the coating liquid vessel and movable in the radial direction of the cylindrical member, the scraping member being approximately concentric to the cylindrical member, by utilizing the liquid pressure of the coating liquid to the scraping member so as to make the center of the cylindrical member coincide with the center of the scraping member.

19. A method for coating a coating liquid according to claim 18, further comprising the steps of:

supplying the coating solution to the coating solution vessel having the scraping member therein; and overflowing the coating solution from the coating solution vessel to maintain the surface of the coating liquid in the coating vessel at a constant level.

20. A method for coating a coating liquid according to claim 18, further comprising the step of:

applying a flow of the coating liquid to the scraping member in the coating liquid vessel.

21. A method for coating a coating liquid according to claim 18, wherein the supply of the coating liquid to the coating liquid vessel is started before the cylindrical member is moved relative to the coating liquid vessel.

22. A method for coating a coating liquid according to claim 18, wherein the moving velocity of the cylindrical member relative to the coating liquid vessel is more than 1 cm/s.

23. A method for coating a coating liquid according to claim 18, wherein the viscosity of the coating liquid is more than 1 Pa's.

24. A method for coating a coating liquid according to claim 21, wherein the cylindrical member is rotated just before or while the cylindrical member is coated.

25. A method for coating a coating liquid according to claim 24, wherein the revolving speed is in the range of 10 rpm to 300 rpm.

26. A coating apparatus for coating an electrophotographic photoreceptor comprising a coating liquid vessel with a liquid leakage preventing member having an opening, for holding a coating liquid for forming the photoreceptor, wherein a cylindrical support for the photoreceptor is inserted into the opening, and the cylindrical support is moved in a vertical direction, relative to the coating liquid vessel to coat the outer periphery of the cylindrical support with the coating liquid, and a scraping member movable in a radial direction relative to said coating liquid vessel for scraping the coating liquid for forming the photoreceptor, said scraping member is concentric to the cylindrical support and is at least partially immersed in the coating liquid, or is positioned above the surface of the coating liquid in the coating liquid vessel, and said scraping member movable in the radial direction of the cylindrical support provided in the coating apparatus.

27. A method for coating a coating liquid for forming an electrophotographic photoreceptor on an outer peripheral surface of a cylindrical support for the photoreceptor, in a coating liquid vessel for holding the coating liquid therein, equipped with a liquid leakage preventing member having an opening, comprising the steps of:

inserting the cylindrical support into the opening;

moving the cylindrical support in a vertical direction, relative to the coating liquid vessel; and moving the cylindrical support to the radial direction thereof while axially aligning a scraping member movable in a radial direction relative to said coating liquid vessel which is at least partially immersed in the coating liquid, or is positioned above the surface of the coating liquid in the coating liquid vessel and movable in a radial direction of the cylindrical support, the scraping member being approximately concentric to the cylindrical support, by utilizing the liquid pressure of the coating liquid to the scraping member so as to make the center of the cylindrical support coincide with the center of the scraping member.

* * * * *